U S009843292B2

United States Patent
Jennings et al.

(10) Patent No.: US 9,843,292 B2
(45) Date of Patent: Dec. 12, 2017

(54) METHOD AND APPARATUS FOR MAINTAINING DC BIAS

(71) Applicant: Knowles Electronics, LLC, Itasca, IL (US)

(72) Inventors: Michael Jennings, Plano, TX (US); Dean Badillo, Schaumburg, IL (US); Craig Stein, Coto de Caza, CA (US)

(73) Assignee: Knowles Electronics, LLC, Itasca, IL (US)

( * ) Notice: Subject to any disclaimer, the term of this patent is extended or adjusted under 35 U.S.C. 154(b) by 0 days.

(21) Appl. No.: 14/883,165

(22) Filed: Oct. 14, 2015

(65) Prior Publication Data

US 2017/0111012 A1    Apr. 20, 2017

(51) Int. Cl.
    *H03F 1/30*    (2006.01)
    *H03F 1/02*    (2006.01)
    (Continued)

(52) U.S. Cl.
    CPC ............ *H03F 1/0205* (2013.01); *H03F 1/32* (2013.01); *H03F 3/04* (2013.01); *H03F 1/30* (2013.01); *H03F 3/181* (2013.01); *H03F 2200/03* (2013.01); *H03F 2200/18* (2013.01); *H03F 2200/228* (2013.01); *H03F 2200/42* (2013.01); *H03F 2200/453* (2013.01);
    (Continued)

(58) Field of Classification Search
    CPC . H03F 1/0205; H03F 1/32; H03F 3/04; H03F 1/34; H03F 2200/153; H03F 1/301; H03F 1/302
    See application file for complete search history.

(56) References Cited

U.S. PATENT DOCUMENTS 3,660,772 A    5/1972   Holt
3,801,933 A    4/1974   Teare
(Continued)

FOREIGN PATENT DOCUMENTS

EP    0982971 A2    1/2000
EP    1331835 A2    7/2003
(Continued)

OTHER PUBLICATIONS

European Patent Office; International Search Report and Written Opinion; PCT International Application No. PCT/US2016/053728; dated Nov. 16, 2016.
(Continued)

*Primary Examiner* — Khanh V Nguyen
(74) *Attorney, Agent, or Firm* — Faegre Baker Daniels LLP

(57) ABSTRACT

A direct current (DC) bias maintenance circuit operably couples to the input of a primary amplifier. The DC bias maintenance circuit employs feedback to maintain the desired DC bias but lacks any coupling to the output of the primary amplifier. By one approach the DC bias maintenance circuit includes a secondary amplifier that replicates at least some near real-time performance characteristics of the primary amplifier. For example, the secondary amplifier can replicate at least certain DC properties of the primary amplifier such that DC-based changes appearing at the output of the primary amplifier are mirrored at an output of the secondary amplifier notwithstanding a lack of any coupling between the output of the primary amplifier and the DC bias maintenance circuit.

17 Claims, 6 Drawing Sheets

(51) Int. Cl.
*H03F 1/32* (2006.01)
*H03F 3/04* (2006.01)
*H03F 3/181* (2006.01)

(52) U.S. Cl.
CPC .. *H03F 2200/471* (2013.01); *H03F 2200/555* (2013.01); *H03F 2200/78* (2013.01)

(56) References Cited

U.S. PATENT DOCUMENTS

| | | | |
|---|---|---|---|
| 3,927,383 | A | 12/1975 | Fjarlie et al. |
| 4,063,050 | A | 12/1977 | Carlson et al. |
| 4,151,480 | A | 4/1979 | Carlson et al. |
| 4,689,819 | A | 8/1987 | Killion |
| 4,754,232 | A | 6/1988 | Sasaki |
| 5,083,095 | A | 1/1992 | Madaffari |
| 5,097,224 | A | 3/1992 | Madaffari et al. |
| 5,193,116 | A | 3/1993 | Mostardo |
| 5,255,094 | A | 10/1993 | Yong et al. |
| 5,337,011 | A | 8/1994 | French et al. |
| 5,524,150 | A | 6/1996 | Sauer |
| 5,861,779 | A | 1/1999 | Loeppert et al. |
| 6,353,344 | B1 | 3/2002 | Lafort |
| 6,617,925 | B2* | 9/2003 | Hoang ............ H03K 19/018528 330/253 |
| 6,714,081 | B1* | 3/2004 | Xu ............ H03F 1/301 323/315 |
| 7,634,096 | B2 | 12/2009 | Fallesen |
| 7,679,448 | B1 | 3/2010 | McAdam et al. |
| 7,920,027 | B2* | 4/2011 | Keerti .............. H03F 1/0261 330/262 |
| 8,970,307 | B2* | 3/2015 | Marra ............ H03F 1/30 330/127 |
| 9,438,175 | B2* | 9/2016 | Onizuka ............ H03F 1/223 |
| 2003/0128856 | A1 | 7/2003 | Boor |
| 2005/0078841 | A1 | 4/2005 | Boor |
| 2005/0213787 | A1 | 9/2005 | Collins |
| 2005/0242791 | A1 | 11/2005 | Rajapandian et al. |
| 2008/0002841 | A1 | 1/2008 | Baker et al. |
| 2011/0025422 | A1 | 2/2011 | Marra et al. |
| 2011/0050345 | A1* | 3/2011 | Quack ............ H03F 1/0266 330/277 |
| 2011/0056302 | A1 | 3/2011 | Lutz |
| 2014/0266458 | A1* | 9/2014 | Scott ............ H03F 3/195 330/291 |
| 2015/0035605 | A1* | 2/2015 | Lam ............ H03F 3/19 330/296 |
| 2015/0214908 | A1* | 7/2015 | Kim ............ H03F 1/0266 330/296 |
| 2015/0244328 | A1* | 8/2015 | Toivonen ............ H03F 1/3241 330/261 |

FOREIGN PATENT DOCUMENTS

| | | |
|---|---|---|
| EP | 2421281 A2 | 2/2012 |
| JP | 60160711 | 8/1985 |
| JP | 2006229336 A | 8/2006 |
| WO | 8302862 A1 | 8/1983 |
| WO | 2005/039046 A1 | 4/2005 |
| WO | 2005/104603 A1 | 11/2005 |
| WO | 2007/103401 A1 | 9/2007 |
| WO | 2014/107843 A1 | 7/2014 |
| WO | 2017/083679 A1 | 5/2017 |

OTHER PUBLICATIONS

European Patent Office; International Search Report and Written Opinion; International Application No. PCT/US2016/061572; dated Feb. 15, 2017.

Van Der Donk et al.; Amplitude-modulated electro-mechanical feedback system for silicon condenser microphones; Journal of Micromechanics & Microengineering, Institute of Physics Publishing; vol. 2, No. 3; Sep. 1, 1992.

Van Der Donk et al.; Preliminary results of a silicon condenser microphone with internal feedback; Transducers; Jun. 24, 1991.

European Patent Office; International Search Report; International Application No. PCT/US2004/033997; dated Mar. 17, 2005.

* cited by examiner

METHOD AND APPARATUS FOR MAINTAINING DC BIAS

TECHNICAL FIELD

These teachings relate generally to DC biasing of amplifiers.

BACKGROUND

Amplifiers are known in the art. In many cases it can be useful to set and/or otherwise control the so-called DC operating point of the amplifier in order to mitigate, for example, clipping of the incoming signal. Unfortunately, at least some known approaches in these regards are either somewhat ineffective for the intended task and/or give rise to other unintended consequences that can negatively impact the signal in other ways.

BRIEF DESCRIPTION OF THE DRAWINGS

The above needs are at least partially met through provision of the method and apparatus for maintaining DC bias described in the following detailed description, particularly when studied in conjunction with the drawings, wherein.

Figure 1:
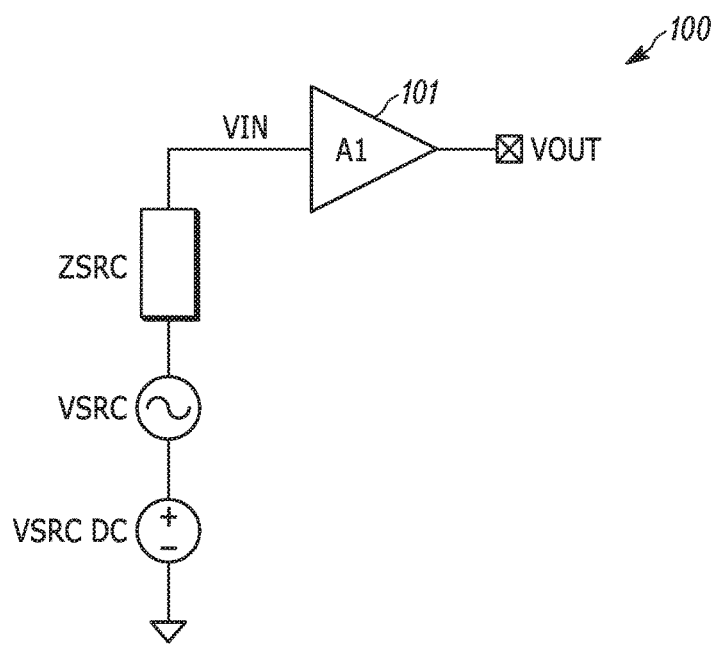
FIG. 1 comprises a schematic diagram as configured in accordance with the prior art.

Elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present teachings. Also, common but well-understood elements that are useful or necessary in a commercially feasible embodiment are often not depicted in order to facilitate a less obstructed view of these various embodiments of the present teachings. Certain actions and/or steps may be described or depicted in a particular order of occurrence while those skilled in the art will understand that such specificity with respect to sequence is not actually required. The terms and expressions used herein have the ordinary technical meaning as is accorded to such terms and expressions by persons skilled in the technical field as set forth above except where different specific meanings have otherwise been set forth herein.

DETAILED DESCRIPTION

Generally speaking, pursuant to these various embodiments, a direct current (DC) bias maintenance circuit operably couples to the input of a primary amplifier. The DC bias maintenance circuit employs feedback to maintain the desired DC bias but lacks any coupling to the output of the primary amplifier. By one approach the DC bias maintenance circuit includes a secondary amplifier that replicates at least some near real-time performance characteristics of the primary amplifier. For example, the secondary amplifier can replicate at least certain DC properties of the primary amplifier such that DC-based changes appearing at the output of the primary amplifier are mirrored at an output of the secondary amplifier notwithstanding a lack of any coupling between the output of the primary amplifier and the DC bias maintenance circuit.

By one approach the DC bias maintenance circuit includes a comparator having one input coupled to the output of the aforementioned secondary amplifier and another input coupled to a reference voltage that comprises a desired output DC operating point of the primary amplifier.

These teachings are highly flexible in practice and will accommodate a variety of modifications. For example, by one approach the output of the aforementioned comparator operably couples to the input of the primary amplifier via a pair of anti-parallel diodes. As another example in these regards, the input of the secondary amplifier can operably couple to the input of the primary amplifier via a low-pass filter.

So configured, the DC bias maintenance circuit can effectively bias an amplifier to achieve a useful linear range while also minimizing distortion due to clipping without the use of global negative feedback. Those skilled in the art will appreciate that these teachings can be employed without involving any alternating current signal and accordingly can avoid any corresponding distortion-inducing behavior in those regards.

These and other benefits may become clearer upon making a thorough review and study of the following detailed description. Referring now to the drawings, it may be helpful to first describe and explain an illustrative application setting and some corresponding illustrative prior art circuits and behavior in those regards.

Referring first to FIG. 1, a first circuit 100 includes an amplifier 101. For the sake of simplicity this amplifier 101 comprises a single-ended amplifier but it will be understood that the present teachings are not so limited. For example, these teachings can be similarly applied with differential amplifiers and other configurations.

This circuit 100 illustrates an incoming signal voltage VSRC and a source impedance represented by ZSRC. In a typical application setting that source impedance is designed to be considerably less than the input impedance of the amplifier 101 in voltage amplification application settings. A corresponding bias voltage is represented by VSRC_DC. DC biasing has the advantage of facilitating signal processing at frequencies that are arbitrarily close to 0 Hz. That said, the properties of the biasing may be unknown to the amplifier designer and potentially incompatible for some operating conditions. For example, this bias may vary undesirably with temperature. Such variances can result in shifting the corresponding DC operating point for the amplifier 101 and this, in turn, can result in or increase distortion.

Figure 2:
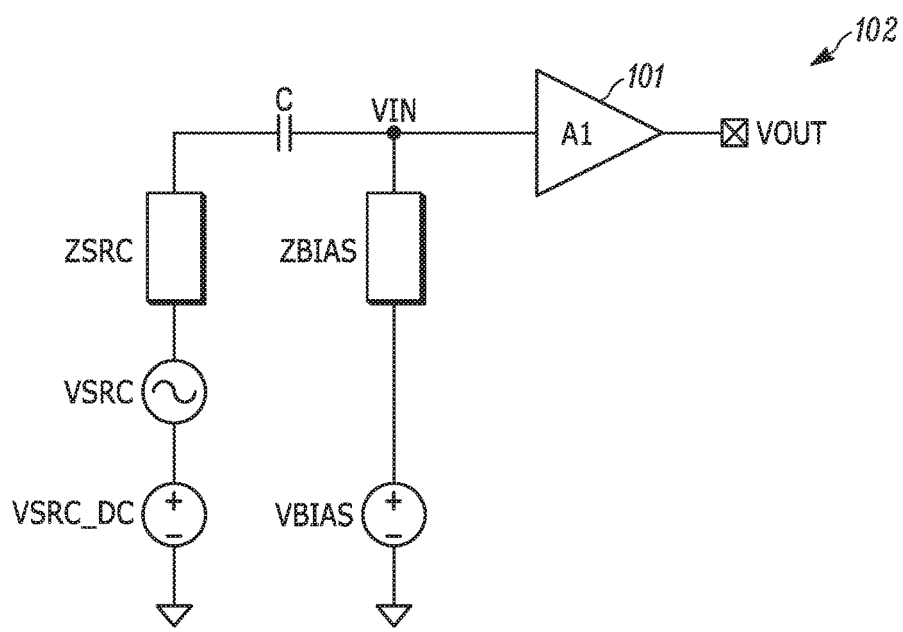
FIG. 2 comprises a schematic diagram as configured in accordance with the prior art.

FIG. 2 illustrates a prior art circuit 102 that attempts to mitigate unknown bias voltage behavior by AC coupling the signal voltage through a capacitor C. This capacitor effectively blocks any bias voltage from the source. The amplifier designer can now design and employ a DC bias circuit that includes a DC bias voltage source VBIAS and the corresponding bias voltage impedance ZBIAS. In a typical application setting the bias voltage impedance is considerably larger than the input impedance of the amplifier 101 to prevent unwanted signal attenuation of the input signal VIN itself.

Figure 3:
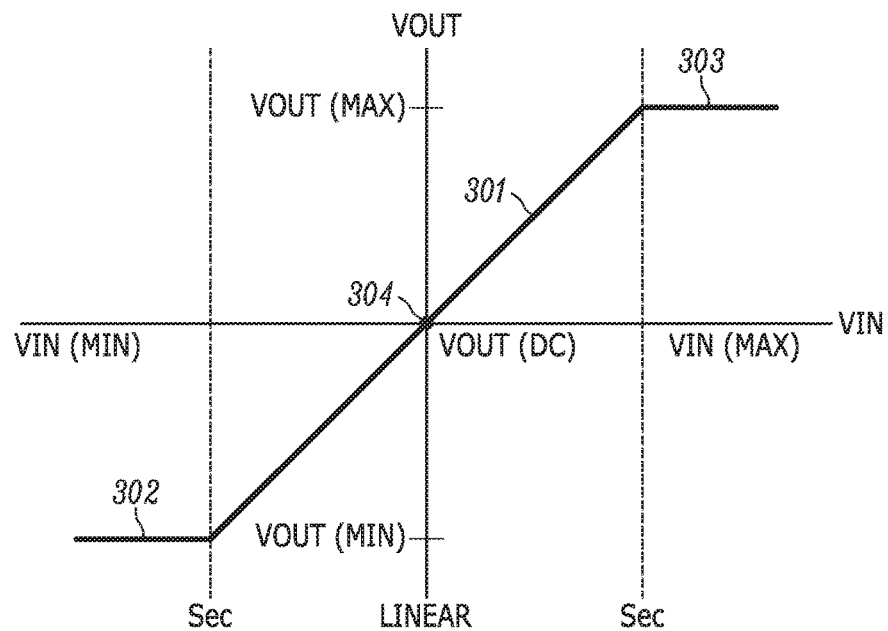
FIG. 3 comprises a graph as configured in accordance with the prior art.

FIG. 3 through FIG. 8 illustrate the importance of setting and/or maintaining a proper DC operating point. FIG. 3 illustrates a plot representing the amplifier's 101 DC transfer function VOUT/VIN. The resultant plot has three main regions. A linear region 301 represents an area where VOUT=A*VIN+VOUT(DC). For the sake of simplicity, in this example the gain A is unity and the output DC bias point is zero (i.e., VOUT(DC)=0). As a result, in this linear region 301 VOUT=VIN. The other two regions 302 and 303 represent low and high saturation regions, respectively. In these saturation regions VOUT remains constant regardless of YIN and equal to VOUT(MIN) and VOUT(MAX) respectively.

Figure 4:
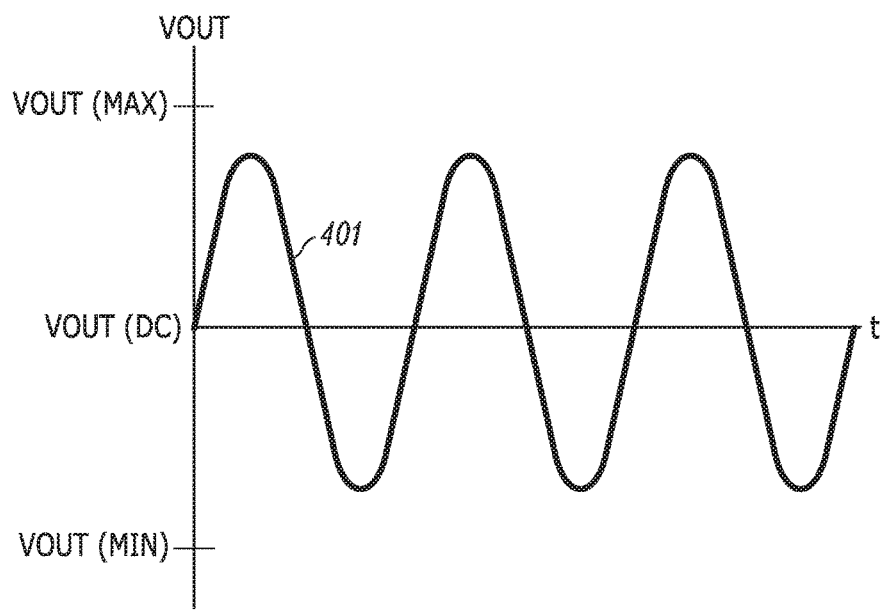
FIG. 4 comprises a graph as configured in accordance with the prior art.

Referring to FIG. 4, a sine wave has been applied to the input of the amplifier 101 and a resultant sine wave 401 appears at the output thereof. This sine wave 401 is centered around VOUT(DC) 304. In this case the amplitude of the incoming sine wave does not exceed VOUT(MAX) or VOUT(MIN) and accordingly the output signal shown in FIG. 4 is undistorted and hence is identical to the input signal.

Figure 5:
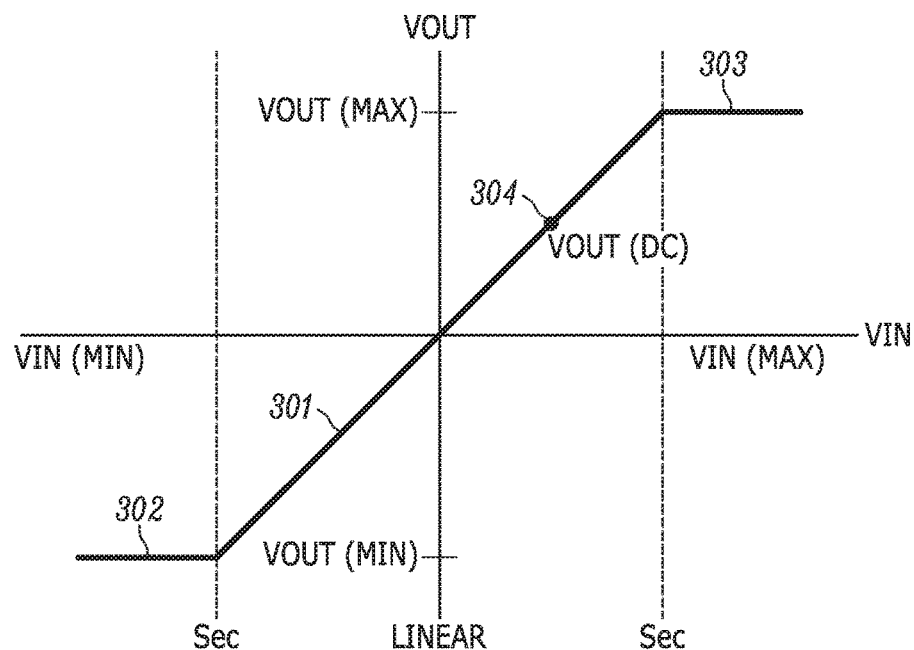
FIG. 5 comprises a graph as configured in accordance with the prior art.
Figure 6:
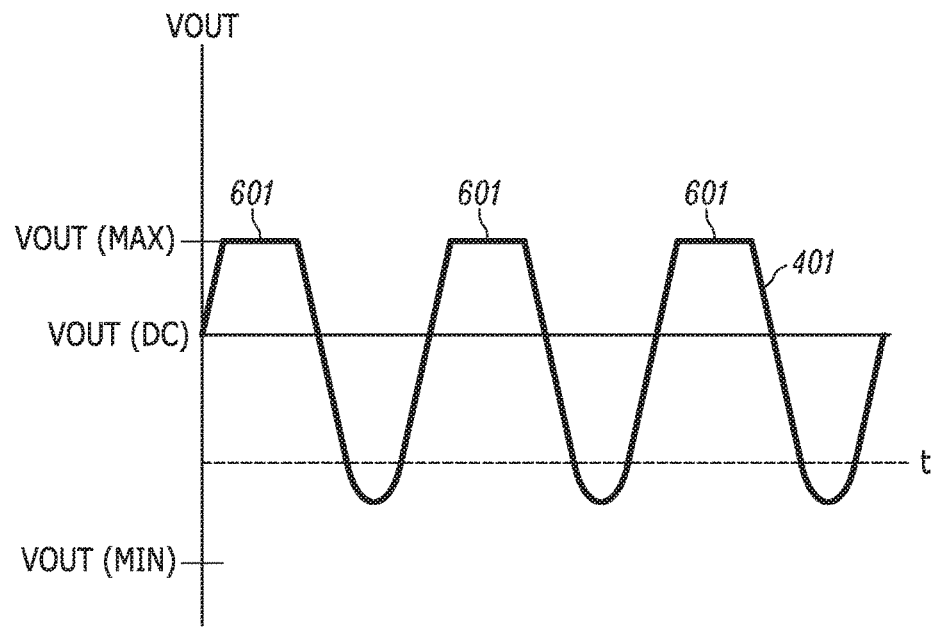
FIG. 6 comprises a graph as configured in accordance with the prior art.
Figure 7:
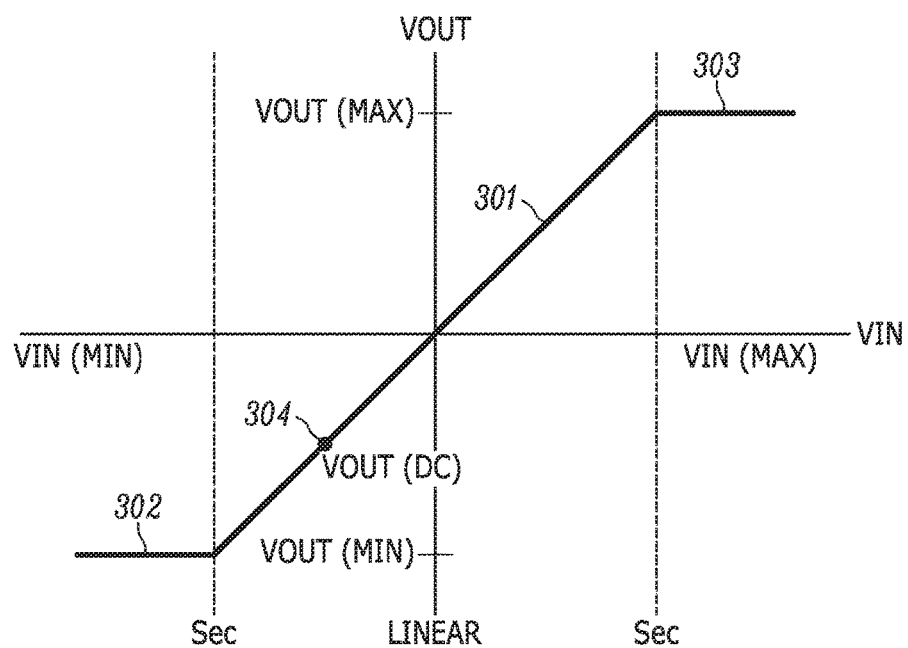
FIG. 7 comprises a graph as configured in accordance with the prior art.
Figure 8:
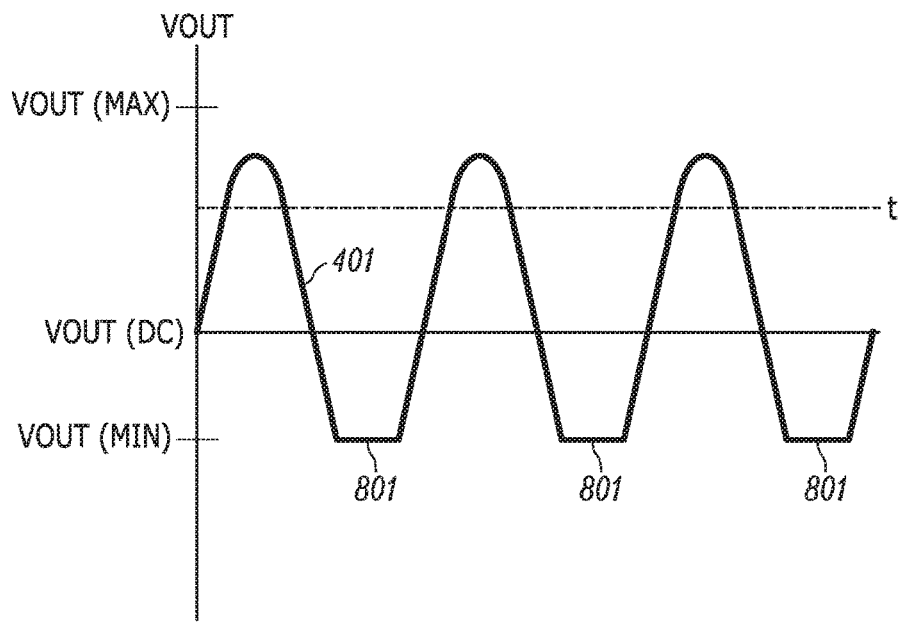
FIG. 8 comprises a graph as configured in accordance with the prior art.

FIG. 5 illustrates the same assumptions as are discussed above in FIG. 3 except that VOUT(DC) 304 is increased. In this case, and referring to FIG. 6, since the sine wave 401 remains centered around VOUT(DC), and since the latter has increased, the positive peaks 601 of the sine wave 401 are now clipped when the output voltage attempts to exceed VOUT(MAX). FIGS. 7 and 8 illustrate that much the same occurs when VOUT(DC) 304 decreases, in which case the negative peaks 801 of the sine wave 401 are now clipped when the output voltage attempts to decrease below VOUT (MIN). In either case the resultant clipping results in distortion.

In many cases it may not be especially helpful to design VBIAS to be constant. This is because the amplifier 101 itself can be sensitive to changes in supply voltage, temperature, and even random manufacturing variations that themselves result in shifts to the operating point even if the bias remains constant. Accordingly, it is known to design the bias to compensate for such variations such that the DC operating point of the amplifier 101 itself remains constant.

Figure 9:
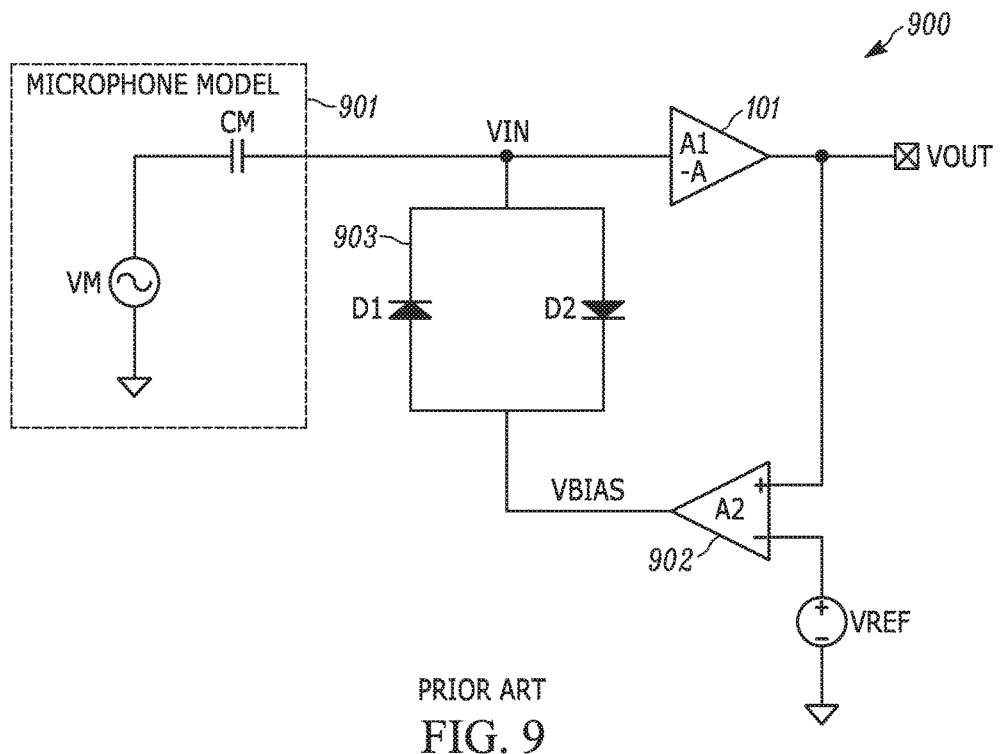
FIG. 9 comprises a schematic diagram as configured in accordance with the prior art.

FIG. 9 presents a prior art circuit 900 that seeks to set and reset as appropriate the amplifier's DC operating point. In this example the bias voltage VBIAS is generated using a global negative feedback loop (i.e., a feedback loop that includes the amplifier 101 itself). In this example a comparator 902 compares VOUT as provided by the amplifier 101 with VREF to generate the bias. The comparator 902 applies the bias to the input VIN of the amplifier 101 through a pair of anti-parallel diodes 903. These diodes 903 present a very high ZBIAS as discussed above when the voltage difference between VIN and VBIAS is zero.

So configured, VOUT can match VREF and accordingly this circuit can set the DC operating point for the amplifier 101, at least when no signal is applied. In practice, such an approach has been proposed for use in decreasing the settling time of the amplifier 101 when used in conjunction with a microphone 901 and the microphone 901 experiences an impulse event such as the slamming of a door. In particular, this circuit operates to apply a signal that is negatively related to VIN to the bottom of the diodes 903. This forward biases one of the diodes (depending on the polarity of VIN) to thereby decrease the diode impedance to bring VIN (and therefore VOUT) back to its quiescent point.

Unfortunately, this same behavior will persist in the presence of a continuous incoming signal. Accordingly, this circuit can act to limit the signal in a way that introduces in and of itself distortion at the input of the amplifier 101.

Figure 10:
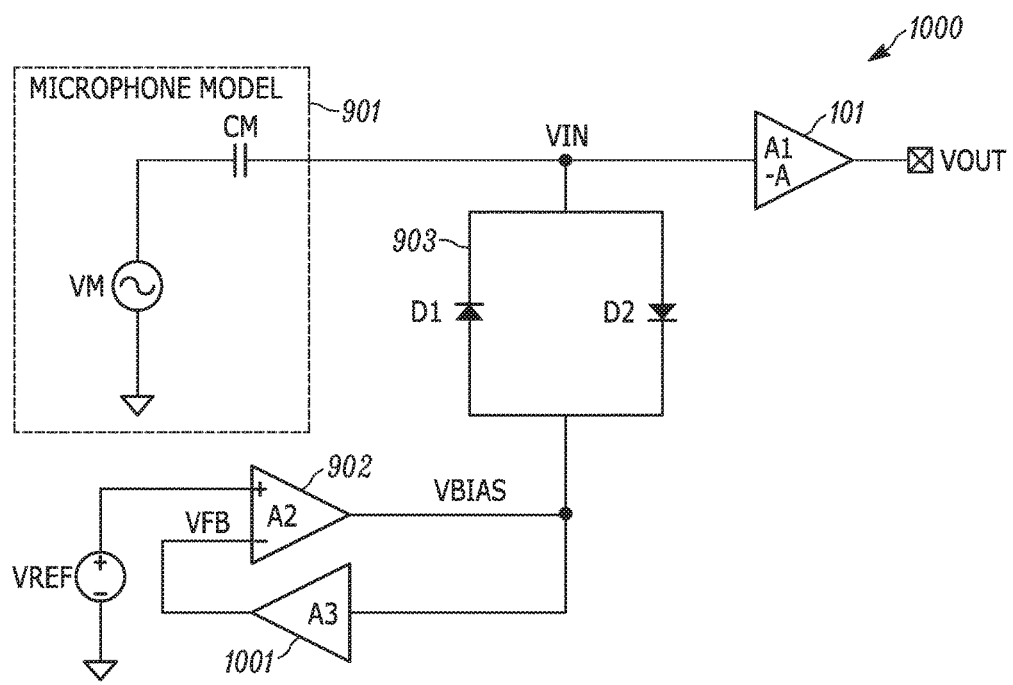
FIG. 10 comprises a schematic diagram as configured in accordance with various embodiments of these teachings.

The present teachings address such concerns by employing a circuit that sets and stabilizes the DC operating point of an amplifier (such as a microphone amplifier) without using global negative feedback. Though employing many of the same components as the circuit 900 described above in FIG. 9, the circuit 1000 shown in FIG. 10 further includes a secondary amplifier 1001 (in contrast to the aforementioned amplifier 101 which is hereafter referred to as the primary amplifier 101).

This secondary amplifier 1001 can comprise a scaled replica of the primary amplifier 101. Accordingly, this secondary amplifier 1001 can have identical DC properties as compared to the primary amplifier 101. These teachings will of course accommodate having the secondary amplifier 1001 be an exact duplicate of the primary amplifier 101 in these regards if desired. Such exactness, however, is not necessarily required for many application settings. For example, it may not be necessary or even useful that the secondary amplifier 1001 be identical to the primary amplifier 101 with respect to non-essential attributes such as physical size or current drain.

In this illustrative example the secondary amplifier 1001 has its input coupled through the aforementioned diodes 903 to the input YIN of the primary amplifier 101. The output of the secondary amplifier 101 connects to one input of the comparator 902, the remaining input of which couples to a reference voltage VREF that is set to the desired DC operating point VOUT(DC). So configured the output of the secondary amplifier 1001 represents a feedback voltage VFB. Accordingly, the comparator 902 compares the reference voltage VREF to a feedback voltage VFB to develop a resultant VBIAS signal.

Because the secondary amplifier 1001 is enclosed in a feedback loop and has the same essential properties as the primary amplifier 101 as described above, any changes in VOUT(DC) will be mirrored in the VFB signal. When VFB is not equal to VREF, negative feedback will adjust VBIAS to thereby restore the condition VREF=VFB=VOUT(DC). Those skilled in the art will note and appreciate that, unlike the solution described above in FIG. 9, this biasing scheme does not involve any AC signals and therefore has no corresponding distortion-inducing behavior.

If desired, and should it be deemed useful to adjust VBIAS below and/or above the minimum/maximum voltage in the circuit 1000 (as established, for example, by ground and VDD) using a charge pump. The comparator 902 can also be biased with a charge pump. Such an approach is readily accommodated in microphone application settings where the primary amplifier 101 is often implemented as a source follower. Also if desired, it may be useful to set VBIAS beyond the available supply limits.

In the foregoing discussion of the circuit 1000 shown in FIG. 9, the average input voltage VIN(AVG) is assumed to equal VBIAS. In practice, however, the two diodes 903 may not be identical diode types. Accordingly, it is possible that the impedance presented by the cross-coupled diodes may not be the same for positive voltages as for negative voltages. In this case the average value of VIN may vary with signal amplitude and hence result in some rectification. Should this occur, the average input will not equal VBIAS and therefore VOUT(DC) will not equal VREF.

Figure 11:
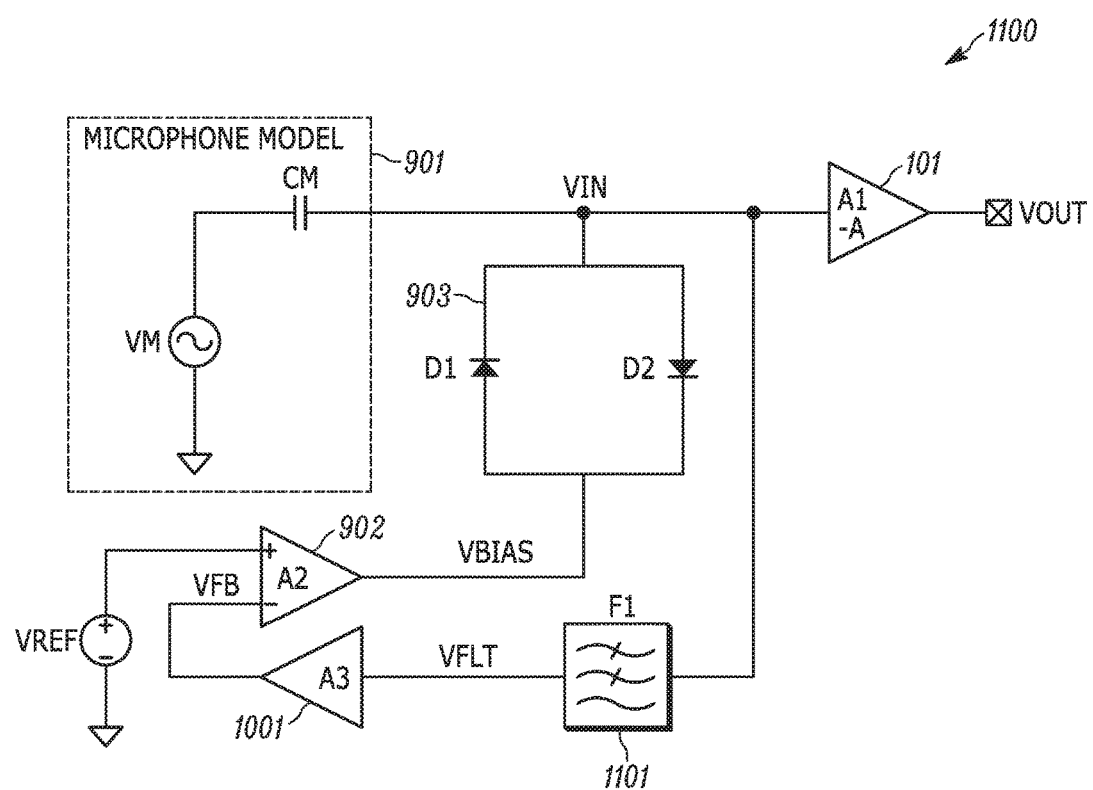
FIG. 11 comprises a schematic diagram as configured in accordance with various embodiments of these teachings.

FIG. 11 presents a circuit 1100 that corrects the foregoing by including the diodes 903 in the bias feedback loop that is otherwise described above. In particular, the input to the secondary amplifier 1001 now connects to the input of the primary amplifier 101 (i.e., VIN) via a low-pass filter 1101. For many application settings the corner frequency for the low-pass filter 1101 can be below 20 Hz but not as low as the filter formed from the diodes 903 and the microphone 901 which needs to be less than 1 Hz for good noise performance in a typical application setting. So configured, the low-pass filter 1101 removes the AC content of VIN so that the resultant filtered signal VFLT is at least approximately equal to VIN(AVG). (These teachings would accommodate, if desired, instead tying the filter 1101 to the output of the primary amplifier 101 to achieve much the same effect.) When VIN constitutes an AC signal, the average value of YIN may not equal VBIAS, but since VFB is now derived from VIN(AVG), the aforementioned negative feedback will now adjust VBIAS such that the desired result (i.e., that VREF=VFB=VOUT(DC)) is achieved.

These teachings can be implemented in a variety of useful application settings and typically in a very economical and reliable manner. Configuring an amplifier circuit pursuant to these teachings results in desired DC biasing of the amplifier without requiring global negative feedback and hence avoids the performance issues that are inherently associated with global negative feedback techniques in these application settings.

Those skilled in the art will recognize that a wide variety of modifications, alterations, and combinations can be made with respect to the above described embodiments without departing from the scope of the invention, and that such modifications, alterations, and combinations are to be viewed as being within the ambit of the inventive concept.

What is claimed is:

1. An audio amplifier apparatus comprising:
   a primary amplifier having an input and an output; and
   a direct current (DC) bias maintenance circuit operably coupled to the input of the primary amplifier, the DC bias maintenance circuit including a secondary amplifier that replicates at least some near real-time performance characteristics of the primary amplifier, wherein the DC bias maintenance circuit further comprises a comparator having a first input operably coupled to an output of the secondary amplifier and a second input operably coupled to a reference voltage, wherein an input to the secondary amplifier operably couples to an output of the comparator, wherein the output of the comparator is further operably coupled to the input of the primary amplifier via a pair of anti-parallel diodes.

2. The apparatus of claim 1 wherein the input of the primary amplifier further operably couples to a microphone.

3. The apparatus of claim 1 wherein the secondary amplifier replicates at least DC properties of the primary amplifier such that DC-based changes appearing at the output of the primary amplifier are mirrored at the output of the secondary amplifier.

4. The apparatus of claim 1 wherein the second input of the comparator operably coupled to the reference voltage comprises a desired output DC operating point of the primary amplifier.

5. The apparatus of claim 1 wherein the output of the comparator further operably couples to the input of the primary amplifier via the pair of anti-parallel diodes and the input to the secondary amplifier operably couples to the output of the comparator via the pair of anti-parallel diodes.

6. The apparatus of claim 5 wherein the input of the secondary amplifier operably couples to the input of the primary amplifier via a low pass filter.

7. The apparatus of claim 1 wherein the input to the secondary amplifier operably couples to the input of the primary amplifier through the pair of anti-parallel diodes.

8. A method of amplifying an audio signal, the method comprising:
   applying an audio signal to an input of an amplifier;
   generating a direct current (DC) bias signal by comparing an output of a secondary amplifier to a reference, the secondary amplifier replicating at least a near real-time performance characteristics of the amplifier;
   applying the DC bias signal to an input of the secondary amplifier; and
   applying the DC bias signal to the input of the amplifier through a pair of anti-parallel diodes, wherein the reference corresponds to a desired DC operating point.

9. The method of claim 8 further comprising replicating at least DC properties of the amplifier at the output of the secondary amplifier.

10. The method of claim 8 wherein the DC bias signal is applied to the input of the secondary amplifier through the pair of anti-parallel diodes.

11. The method of claim 8 wherein the DC bias signal is applied to the input to the secondary amplifier through the pair of anti-parallel diodes.

12. The method of claim 11 wherein the DC bias signal is applied to the input of the secondary amplifier via a low pass filter.

13. An audio amplifier apparatus comprising:
   a primary amplifier having an input and an output; and
   a direct current (DC) feedback-based bias maintenance circuit operably coupled to the input of the primary amplifier, the DC feedback-based bias maintenance circuit lacking any coupling to the output of the primary amplifier, wherein the DC feedback-based bias maintenance circuit comprises:
   a secondary amplifier; and
   a comparator having a first input operably coupled to an output of the secondary amplifier and a second input operably coupled to a reference voltage, wherein an input to the secondary amplifier operably couples to an output of the comparator, wherein the output of the comparator is further operably coupled to the input of the primary amplifier via a pair of anti-parallel diodes.

14. The apparatus of claim 13 wherein the DC feedback-based bias maintenance circuit is configured to mirror DC-based changes that appear at the output of the primary amplifier.

15. The apparatus of claim 13 wherein the input to the secondary amplifier operably couples to the output of the comparator through the pair of anti-parallel diodes.

16. The apparatus of claim 15 wherein the input of the secondary amplifier operably couples to the input of the primary amplifier through a low pass filter.

17. The apparatus of claim 13 wherein the input to the secondary amplifier operably couples to the input of the primary amplifier through the pair of anti-parallel diodes.

* * * * *